United States Patent
Li (10) Patent No.: US 10,741,661 B2
(45) Date of Patent: Aug. 11, 2020

(54) CONDUCTIVE LAYER, THIN FILM TRANSISTOR AND MANUFACTURING METHODS THEREFOR, ARRAY SUBSTRATE AND DISPLAY DEVICE

(71) Applicant: BOE Technology Group Co., Ltd., Beijing (CN)

(72) Inventor: Haixu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 9 days.

(21) Appl. No.: 15/828,768

(22) Filed: Dec. 1, 2017

(65) Prior Publication Data
US 2018/0212032 A1    Jul. 26, 2018

(30) Foreign Application Priority Data
Jan. 20, 2017    (CN) .......................... 2017 1 0040583

(51) Int. Cl.
*H01L 29/45*    (2006.01)
*H01L 29/49*    (2006.01)
(Continued)

(52) U.S. Cl.
CPC .......... *H01L 29/458* (2013.01); *H01L 21/321* (2013.01); *H01L 21/32134* (2013.01);
(Continued)

(58) Field of Classification Search
CPC ............. H01L 29/458; H01L 21/32134; H01L 21/321; H01L 29/4908; H01L 29/78669;
(Continued)

(56) References Cited

U.S. PATENT DOCUMENTS

2003/0073860 A1*    4/2003    Choi ................. C23C 16/18
                                                          556/10
2004/0163758 A1*    8/2004    Kagan ................. B82Y 30/00
                                                          156/230
(Continued)

FOREIGN PATENT DOCUMENTS

| CN | 101645456 A | 2/2010 |
| CN | 104766803 A | 7/2015 |
| CN | 105140296 A | 12/2015 |

OTHER PUBLICATIONS

First Office Action of priority Chinese application No. 201710040583.4 (including English translation) dated Feb. 1, 2019.

*Primary Examiner* — Steven H Loke
*Assistant Examiner* — Juanita B Rhodes
(74) *Attorney, Agent, or Firm* — Fay Sharpe LLP (57) ABSTRACT

The present disclosure relates to a conductive layer, a thin film transistor and manufacturing methods therefor, an array substrate and a display device, in the field of displays. The conductive layer comprises: a metal layer and an organophosphorus-metal complex covering the metal layer. In the embodiments of the present disclosure, the organophosphorus-metal complex is manufactured on the surface of the metal layer to form the conductive layer. The conductive layer is adopted as an electrode material. In one aspect, the organophosphorus-metal complex has conductivity and can prevent the surface of metal from making contact with oxygen, thereby avoiding metal oxidation under the premise of not affecting the performances of the electrode when serving as a material of the electrode in a TFT. In the other aspect, the organophosphorus-metal complex can increase a binding force between the metal and photoresist and avoids stripping of the photoresist. Therefore, etching liquid is prevented from etching the metal in a position without the need of etching. The conductive layer provided by the (Continued)

present disclosure has the performances in the above two aspects. Therefore, the stability and electronic transmission performances of the electrode can be improved by adopting such a conductive layer to manufacture the electrode of the thin film transistor.

8 Claims, 5 Drawing Sheets

(51) Int. Cl.
*H01L 21/321* (2006.01)
*H01L 21/3213* (2006.01)
*H01L 29/786* (2006.01)
*H01L 29/66* (2006.01)

(52) U.S. Cl.
CPC .... *H01L 21/32139* (2013.01); *H01L 29/4908* (2013.01); *H01L 29/66765* (2013.01); *H01L 29/78669* (2013.01)

(58) Field of Classification Search
CPC ......... H01L 29/66765; H01L 21/32139; H01L 21/28; H01L 29/12; H01L 29/43; H01L 29/6675; H01L 29/786
See application file for complete search history.

(56) References Cited

U.S. PATENT DOCUMENTS

| | | |
|---|---|---|
| 2007/0145480 A1* | 6/2007 | Cheng ................. H01L 51/0021 257/347 |
| 2009/0308496 A1 | 12/2009 | Kawamata et al. |
| 2011/0198113 A1* | 8/2011 | Hanson .................... H01B 1/22 174/257 |
| 2017/0040342 A1 | 2/2017 | Ning et al. |
| 2018/0114864 A1 | 4/2018 | Liu |

* cited by examiner

CONDUCTIVE LAYER, THIN FILM TRANSISTOR AND MANUFACTURING METHODS THEREFOR, ARRAY SUBSTRATE AND DISPLAY DEVICE

The present disclosure claims priority to Chinese Patent Application No. 201710040583.4, filed with the Chinese Intellectual Property Office on Jan. 20, 2017 and titled "Conductive Layer, Thin Film Transistor and Manufacturing Methods therefor, Array Substrate and Display Device", which is incorporated herein by reference in its entirety.

TECHNICAL FIELD

The present disclosure relates to the field of displays, and particularly relates to a conductive layer, a thin film transistor and manufacturing methods therefor, an array substrate and a display device.

BACKGROUND

A thin film transistor (TFT) is an important constituent part of a liquid crystal display (LCD). The TFT comprises a base, and a gate electrode, a gate electrode insulating layer, an active layer, a source/drain (S/D) electrode and an insulating protective layer which are laminated on the base in sequence.

A material with small resistance and high conductivity, for example, Cu or Al, is usually selected as the material of an electrode (the gate electrode or S/D electrode) in the TFT, such that the power consumption and the voltage drop are reduced and a response speed is improved. By taking Cu as an example, when Cu is adopted to manufacture the electrode, a layer of Cu is deposited at first, then a photoresist pattern is formed on the layer of Cu, and then the part not shielded by the photoresist pattern is etched by adopting an etching liquid to obtain the electrode. However, in one aspect, since Cu is high in conductivity, there exists a thinning requirement when the electrode is manufactured. In order to manufacture the electrode with a smaller width, during etching, the corresponding photoresist pattern is also thinner. In addition, a binding force between Cu and the photoresist is not high enough, and as a result, the photoresist is easy to strip. In another aspect, the etching liquid adopted for etching Cu is small in viscosity and can easily enters a space between the photoresist and Cu. For the reasons in these two aspects, the etching liquid may etch Cu in a position without a need of etching. Besides, Cu is more active and can be easily oxidized when making contact oxygen and water, which affects a contact resistance between the electrode and other film layers.

Therefore, when Cu or Al is adopted to manufacture the electrode, the problems of how to prevent the etching liquid from etching Cu or Al in the position without the need of etching and how to avoid oxidation of Cu or Al, etc., are especially important.

SUMMARY

The present disclosure provides a conductive layer, a thin film transistor and manufacturing methods therefor, an array substrate and a display device, capable of solving the problems of how to prevent the etching liquid from etching Cu or Al in the position without the need of etching and how to avoid oxidation of Cu or Al. The technical solutions are as follows:

In a first aspect, embodiments of the present disclosure provide a conductive layer. The conductive layer comprises: a metal layer and an organophosphorus-metal complex covering the metal layer.

In an implementation of the embodiments of the present disclosure, the metal layer is a copper layer, and the organophosphorus-metal complex is an organophosphorus-copper complex; or the metal layer is an aluminum layer, and the organophosphorus-metal complex is an organophosphorus-aluminum complex.

In another implementation of the embodiments of the present disclosure, a thickness of the metal layer is 3000-5000 Å.

In another implementation of the embodiments of the present disclosure, a thickness of the organophosphorus-metal complex is 500-2000 Å.

In a second aspect, embodiments of the present disclosure provide a preparing method for a conductive layer. The method comprises: providing a metal layer; and manufacturing a layer of organophosphorus-metal complex on the metal layer.

In an implementation of the embodiments of the present disclosure, the metal layer is a copper layer, and the organophosphorus-metal complex is an organophosphorus-copper complex; or the metal layer is an aluminum layer, and the organophosphorus-metal complex is an organophosphorus-aluminum complex.

In another implementation of the embodiments of the present disclosure, manufacturing a layer of organophosphorus-metal complex on the metal layer comprises: adopting a wet-etching device to spray a phosphorus-containing liquid on the surface of the metal layer, to form a layer of organophosphorus-metal complex; or, manufacturing a layer of organophosphorus-metal complex on the metal layer, comprises: enabling metal powder to react with the phosphorus-containing liquid, and drying reacted products; using the dried products as a target material, and adopting a sputtering process to manufacture a layer of organophosphorus-metal complex on the metal layer.

In another implementation of the embodiments of the present disclosure, the phosphorus-containing liquid is an organophosphorus compound solution, solutions of phosphoric acid and derivatives thereof, a phosphite ester solution or a phosphorus-containing heterocyclic compound solution.

In a third aspect, embodiments of the present disclosure provide a thin film transistor. The thin film transistor comprises: a base, and a gate electrode, a gate electrode insulating layer, an active layer and a source/drain electrode which are disposed on the base in sequence;

wherein at least one of the gate electrode and the source/drain electrode is manufactured from the conductive layer described in any embodiment in the first aspect.

In a fourth aspect, embodiments of the present disclosure provide a manufacturing method for a thin film transistor. The method comprises: providing a base; and manufacturing a gate electrode, a gate electrode insulating layer, an active layer and a source/drain electrode on the base in sequence; wherein at least one of the gate electrode and the source/drain electrode is manufactured by adopting at least one of the following manners: manufacturing a metal layer; manufacturing a layer of organophosphorus-metal complex on the metal layer; and performing patterning treatment on the metal layer and the organophosphorus-metal complex thereon to obtain the gate electrode or the source/drain electrode.

In an implementation of the embodiments of the present disclosure, the metal layer is a copper layer, and the organophosphorus-metal complex is an organophosphorus-copper complex; or the metal layer is an aluminum layer, and the organophosphorus-metal complex is an organophosphorus-aluminum complex.

In another implementation of the embodiments of the present disclosure, when the gate electrode is obtained by performing patterning treatment on the metal layer and the organophosphorus-metal complex thereon, the method further comprises: performing medium-temperature tempering treatment on the gate electrode, a temperature of the medium-temperature tempering treatment being lower than a recrystallization temperature of a metal adopted by the metal layer.

In another implementation of the embodiments of the present disclosure, when the source/drain electrode is obtained by performing patterning treatment on the metal layer and the organophosphorus-metal complex thereon, the method further comprises: performing medium-temperature tempering treatment on the source/drain electrode, a temperature of the medium-temperature tempering treatment being lower than a recrystallization temperature of a metal adopted by the metal layer.

In a fifth aspect, embodiments of the present disclosure provide an array substrate. The array substrate comprises a thin film transistor, wherein the thin film transistor comprises a base, and a gate electrode, a gate electrode insulating layer, an active layer and a source/drain electrode which are disposed on the base in sequence; the array substrate further comprises a gate line disposed on the same layer as the gate electrode and a data line disposed on the same layer as the source/drain electrode; and at least one of the gate electrode, the source/drain electrode, the gate line and the data line is manufactured from the conductive layer described in any embodiment in the first aspect.

In a sixth aspect, embodiments of the present disclosure provide a display device. The display device comprises the array substrate described in any embodiment in the fifth aspect.

The technical solution provided by the present disclosure may include the following advantageous benefits.

According to the embodiment of the present disclosure, the organophosphorus-metal complex is manufactured on the surface of the metal layer to form the conductive layer. The conductive layer is adopted as an electrode material. In one aspect, the organophosphorus-metal complex has conductivity and can prevent the surface of metal from making contact with oxygen, and can avoid metal oxidation under a premise of not affecting the performances of the electrode when serving as a material of the electrode in a TFT. In the other aspect, the organophosphorus-metal complex can increase a binding force between the metal and photoresist and avoids stripping of the photoresist. Therefore, an etching liquid is prevented from etching the metal in a position without the need of etching. The conductive layer provided by the present application has the performances in the above two aspects. Therefore, the stability and electronic transmission performances of the electrode can be improved by adopting such a conductive layer to manufacture the electrode of the thin film transistor.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

In order to clarify the objects, technical solutions and advantages of the present disclosure, the embodiments of the present disclosure will be further described in detail with reference to the drawings.

Figure 1:
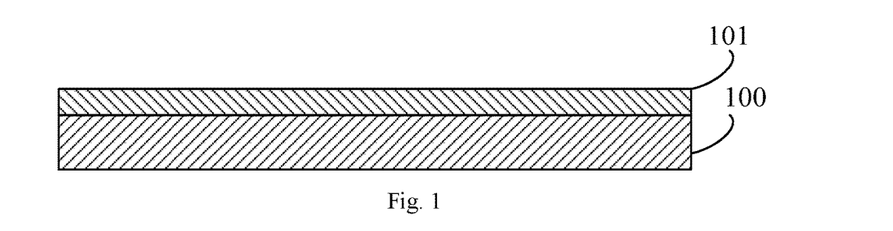
FIG. 1 is a structural schematic diagram of a conductive layer of the embodiments of the present disclosure.

FIG. 1 is a structural schematic diagram of a conductive layer provided by the embodiment of the present invention. Referring to FIG. 1, the conductive layer comprises: a metal layer 100 and an organophosphorus-metal complex 101 covering the metal layer 100.

The microscopic structure of the organophosphorus-metal complex 101 is of a micropore structure and makes firm contact with the metal layer 100. The organophosphorus-metal complex 101 has better absorbability, wettability and oxygen resistant capacity. The organophosphorus-metal complex 101 is formed on the metal layer 100, such that the surface of the metal layer is effectively prevented from oxidation while conductivity is not affected. In addition, the conductive layer has better stability and oxidation resistance under high temperature.

In the embodiments of the present disclosure, the organophosphorus-metal complex is manufactured on the surface of the metal layer to form the conductive layer. The conductive layer is adopted as an electrode material. In one aspect, the organophosphorus-metal complex has conductivity and can prevent the surface of metal from making contact with oxygen, thereby avoiding metal oxidation under the premise of not affecting the performances of the electrode when serving as a material of the electrode in a TFT. In the other aspect, the organophosphorus-metal complex can increase a binding force between the metal and photoresist and avoids stripping of the photoresist. Therefore, etching liquid is prevented from etching the metal in a position without the need of etching. The conductive layer provided by the present disclosure has the performances in the above two aspects. Therefore, the stability and electronic transmission performances of the electrode can be improved by adopting such a conductive layer to manufacture the electrode of the thin film transistor.

When the electrode or the electrode wire of the TFT is manufactured, only the metal with high conductivity has a thinning requirement, and only then will the problems that the metal is easy to etch, the photoresist thereon is easy to strip, and the like occur. The metal layer 100 in the conductive layer above is made of, for example, Cu or Al. Of course, other metals for manufacturing the electrode, for example, Mo, Cr, Ti, etc., are not limited by the embodiments of the present disclosure. Exemplarily, when the metal layer 100 is a copper layer, the organophosphorus-metal complex 101 is an organophosphorus-copper complex; or, when the metal layer 100 is an aluminum layer, the organophosphorus-metal complex 101 is an organophosphorus-aluminum complex.

In the embodiment of the present disclosure, the thickness of the metal layer is 3000-5000 Å. By taking the copper as an example, when the thickness of the copper layer is 3000-5000 Å, the resistance is 0.1-0.05Ω/□ (square resistance). It can be known that if the thickness of the metal layer is designed to be 3000-5000 Å, the manufacturing requirements of the electrode of the TFT can be met.

In the embodiment of the present disclosure, the thickness of the organophosphorus-metal complex is 500-2000 Å. By taking the copper as an example, when the thickness of the organophosphorus-copper complex is 500-2000 Å, the resistance is 0.7-0.3Ω/□, and here, the resistance value of the whole conductive layer is 0.2-0.1Ω/□. It can be known that if the thickness of the organophosphorus-metal complex is designed to be 500-2000 Å, the difference between the resistance value of the conductive layer provided by the embodiment of the present disclosure and the resistance value of the conductive layer purely made of metal becomes smaller. Therefore, if the thickness of the organophosphorus-metal complex is designed to be 500-2000 Å, the thickness of the whole electrode is not overlarge and therefore a final panel thickness is not be affected when the conductive layer is adopted to manufacture the electrode, and the problem that the requirement on metal protection cannot be met caused by an excessively small thickness of the organophosphorus-metal complex is avoided.

Figure 2:
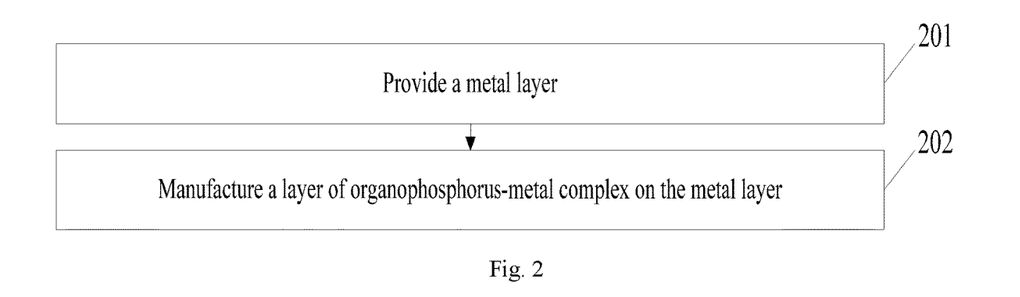
FIG. 2 is a flow diagram of a manufacturing method of a conductive layer of the embodiments of the present disclosure.

FIG. 2 is a flow diagram of a manufacturing method of a conductive layer of the embodiments of the present disclosure. As shown in FIG. 2, the method comprises:

At step 201: a metal layer is provided.

In the embodiments of the present disclosure, providing the metal layer may include: adopting a sputtering process to manufacture the metal layer.

At step 202, a layer of organophosphorus-metal complex is manufactured on the metal layer.

In the embodiments of the present disclosure, the organophosphorus-metal complex is manufactured on the surface of the metal layer to form the conductive layer. The conductive layer is adopted as an electrode material. In one aspect, the organophosphorus-metal complex has conductivity and can prevent the surface of metal from making contact with oxygen, thereby avoiding metal oxidation under a premise of not affecting the performances of the electrode when serving as a material of the electrode in a TFT. In the other aspect, the organophosphorus-metal complex can increase a binding force between the metal and photoresist and avoids stripping of the photoresist. Therefore, etching liquid is prevented from etching the metal in a position without the need of etching. The conductive layer provided by the present disclosure has the performances in the above two aspects. Therefore, the stability and electronic transmission performances of the electrode can be improved by adopting such a conductive layer to manufacture the electrode of the thin film transistor.

When the electrode or an electrode wire of the TFT is manufactured, only the metal with high conductivity has a thinning requirement, and only then will the problems that the metal is easy to etch, the photoresist thereon is easy to strip and the like occur. The metal layer in the conductive layer above is made of, for example, Cu or Al. Of course, other metals for manufacturing the electrode, for example, Mo, Cr, Ti, etc., are not limited by the embodiments of the present disclosure. Exemplarily, when the metal layer is a copper layer, the organophosphorus-metal complex is an organophosphorus-copper complex; or, when the metal layer is an aluminum layer, the organophosphorus-metal complex is an organophosphorus-aluminum complex.

In one possible implementation, the foresaid step 202 may comprise:

A wet-etching device is adopted to spray phosphorus-containing liquid on the surface of the metal layer, to form a layer of organophosphorus-metal complex. In this implementation, it's simple and convenient to adopt the wet-etching device required for manufacturing the electrode in the TFT to manufacture the organophosphorus-metal complex, and no new device is required.

In this implementation, a spraying temperature can be 35-50° C. By adopting such a temperature, normal manufacturing of the organophosphorus-metal complex can be guaranteed.

In this implementation, spraying time can be 30-90 seconds. By adopting such time, normal manufacturing of the organophosphorus-metal complex can be guaranteed.

In another implementation, the foresaid step 202 may comprise:

Metal powder is enabled to react with the phosphorus-containing liquid, and reacted products are dried; and the dried products are used as a target material, and a sputtering process is adopted to manufacture a layer of organophosphorus-metal complex on the metal layer. In this implementation, it's simple and convenient to adopt the sputtering process to manufacture the organophosphorus-metal complex, and no new device is required (deposition of the metal layer may also be achieved by adopting the sputtering process, therefore, the metal layer and the organophosphorus-metal complex may be manufactured by adopting the same device).

In this implementation, when the metal powder reacts with the phosphorus-containing liquid, the metal powder may react with sufficient phosphorus-containing liquid. In the embodiments of the present disclosure, a mass fraction ratio of the metal powder to the phosphorus-containing liquid may be 1:20.

In this implementation, drying the reacted products may comprise: drying the reacted products under the temperature of 200-250° C.

In this implementation, when the sputtering process is adopted to manufacture a layer of organophosphorus-metal complex on the metal layer, the sputtering temperature is generally not higher than 50° C.

In the two foresaid implementations, the phosphorus-containing liquid may be an organophosphorus compound solution (for example, the organophosphorus compound solution prepared by taking α-naphthol and phosphorus trichloride as raw materials (an organophosphorus compound prepared by taking the α-naphthol and phosphorus trichloride as raw materials has a stable pentacyclic structure)), solutions of phosphoric acid and derivatives thereof, a phosphite ester solution or a phosphorus-containing heterocyclic compound solution. Any one of the solutions above may react with the metal to form the organophosphorus-metal complex.

In the embodiments of the present disclosure, the thickness of the metal layer may be 3000-5000 Å, thereby meeting the manufacturing needs of the electrode of the TFT. The thickness of the organophosphorus-metal complex may be 500-2000 Å. Here, the thickness of the whole electrode is not overlarge, and therefore a final panel thickness is not be affected when the conductive layer is adopted to manufacture the electrode, and the problem that the requirement on metal protection is not met caused by an over small thickness of the organophosphorus-metal complex is avoided.

Figure 3:
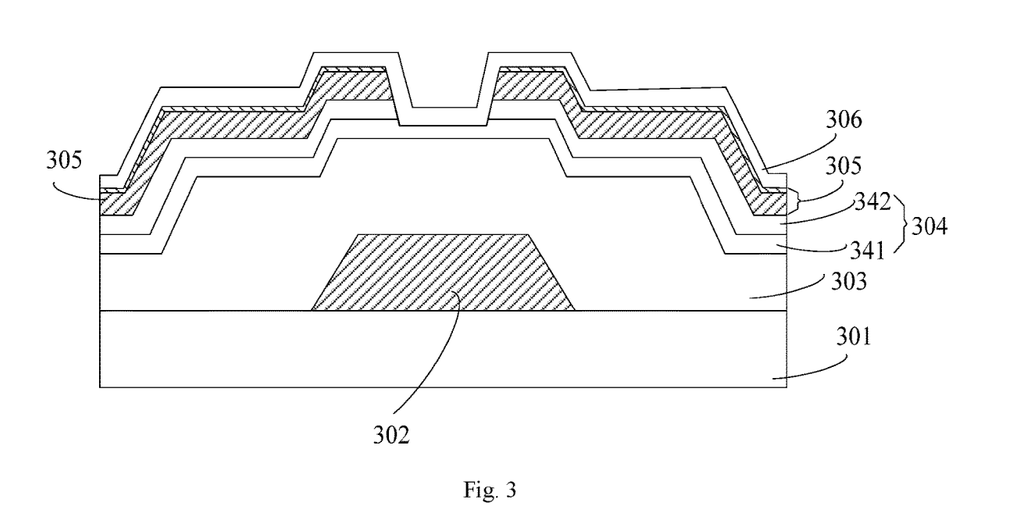
FIG. 3 is a structural schematic diagram of a thin film transistor of the embodiments of the present disclosure.

FIG. 3 is a structural schematic diagram of a thin film transistor provided by the embodiments of the present disclosure. Referring to FIG. 3, the thin film transistor comprises a base 301, and a gate electrode 302, a gate electrode insulating layer 303, an active layer 304 and a source/drain electrode 305 which are disposed on the base 301 in sequence. Wherein at least one of the gate electrode 302 and the source/drain electrode 305 is manufactured from the conductive layer as shown in FIG. 1.

The embodiments of the present disclosure adopt the conductive layer formed by the metal layer and the organophosphorus-metal complex to manufacture at least one of the gate electrode and the source/drain electrode. In one aspect, the organophosphorus-metal complex has conductivity and can prevent the surface of the metal from making contact with oxygen, thereby preventing metal oxidation under a premise of not affecting performances of the electrode when serving as a material of the electrode in the TFT. In the other aspect, the organophosphorus-metal complex can increase a binding force between the metal and photoresist and avoids stripping of the photoresist. Therefore, the etching liquid is prevented from etching the metal in a position without the need of etching. The conductive layer provided by the present disclosure has the performances in the two aspects above. Therefore, the stability and electronic transmission performances of the electrode can be improved by adopting this conductive layer to manufacture the electrode of the thin film transistor.

In the embodiments of the present disclosure, the base 301 may be a transparent base, for example, a glass base, a silicon base, a plastic base, etc. The gate electrode insulating layer 303 may be a silicon nitride or silicon oxynitride layer.

In the embodiments of the present disclosure, the active layer 304 may be made of amorphous silicon, microcrystalline silicon or polycrystalline silicon. For example, the active layer 304 may comprise an amorphous silicon layer 341 disposed on the gate electrode insulating layer 303 and an N-type doped amorphous silicon layer 342 disposed on the amorphous silicon layer 341. By disposing the N-type doped amorphous silicon layer on the amorphous silicon layer, direct contact between the amorphous silicon layer and the source/drain electrode can be avoided, and lattice mismatching between the amorphous silicon layer and the source/drain electrode is reduced.

Further, the thin film transistor may also comprise a passivation layer 306 disposed on the source/drain electrode 305. The passivation layer 306 is disposed to play a role of protecting the TFT. Wherein, the passivation layer may be a silicon nitride or a silicon oxynitride layer.

Figure 4:
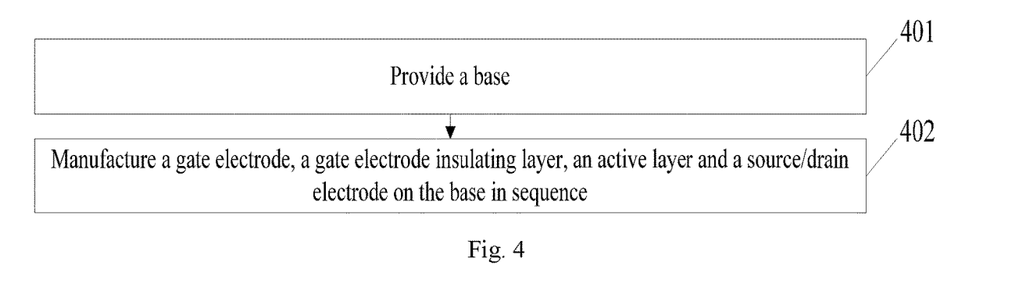
FIG. 4 is a flow diagram of a manufacturing method of a thin film transistor of the embodiments of the present disclosure.

FIG. 4 is a flowchart of a manufacturing method for a thin film transistor provided by the embodiments of the present disclosure. Referring to FIG. 4, the method comprises the following steps 401-402.

Step 401: a base is provided.

Step 402: a gate electrode, a gate electrode insulating layer, an active layer and a source/drain electrode are manufactured on the base in sequence.

The manufacturing process for the thin film transistor is explained by FIGS. 5-10.

Figure 5:
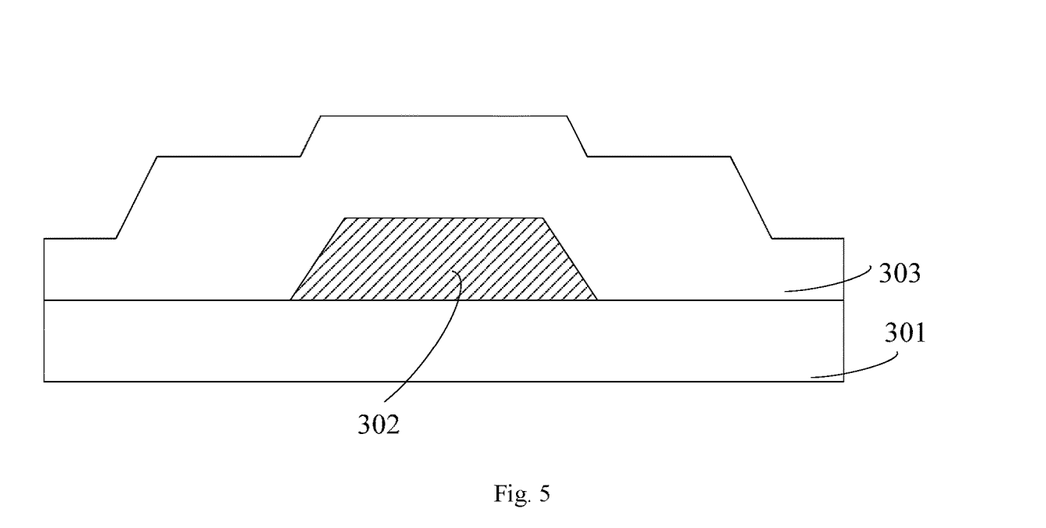
FIG. 5 is a structural schematic diagram of a manufacturing process of a thin film transistor of the embodiments of the present disclosure.

As shown in FIG. 5, the base 301 is provided at first and is washed. Then the gate electrode 302 is manufactured on the base 301 by adopting a patterning process. The base 301 may be a transparent base, for example, a glass base, a silicon base, a plastic base, etc.

After the gate electrode 302 is manufactured, a layer of gate electrode insulating layer 303 is manufactured on the base 301 where the gate electrode 302 is manufactured. For example, a layer of gate electrode insulating layer 303 is deposited on the base 301 where the gate electrode 302 is manufactured. The gate electrode insulating layer 303 may be a silicon nitride or a silicon oxynitride layer.

Figure 6:
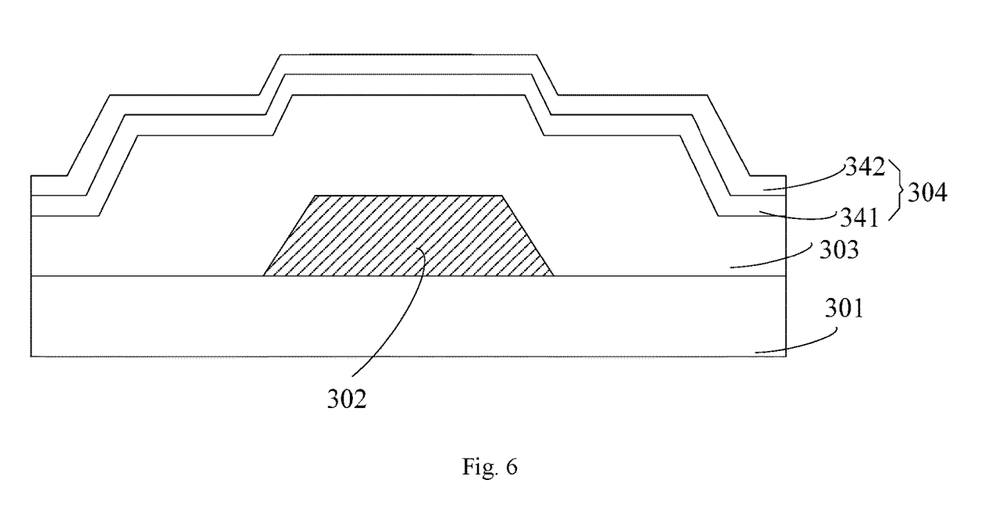
FIG. 6 is a structural schematic diagram of a manufacturing process of a thin film transistor of the embodiments of the present disclosure.

As shown in FIG. 6, after the gate electrode insulating layer 303 is formed, amorphous silicon and N-type doped amorphous silicon grows in sequence (may be implemented by a deposition manner, for example, a plasma enhanced chemical vapor deposition (PECVD) can be adopted). Then, the amorphous silicon layer 341 and the N-type doped amorphous silicon layer 342 as shown in FIG. 6 are formed by the patterning process (may be implemented by a photoetching process, and an etching technology in the photoetching process may be realized by inductive coupled plasma (ICP) etching).

Figure 7:
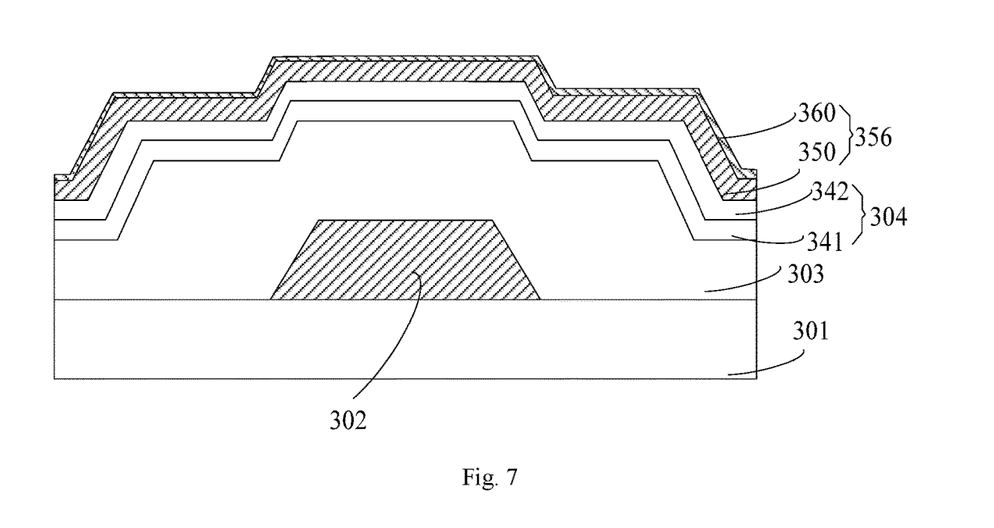
FIG. 7 is a structural schematic diagram of a manufacturing process of a thin film transistor of the embodiments of the present disclosure.
Figure 8:
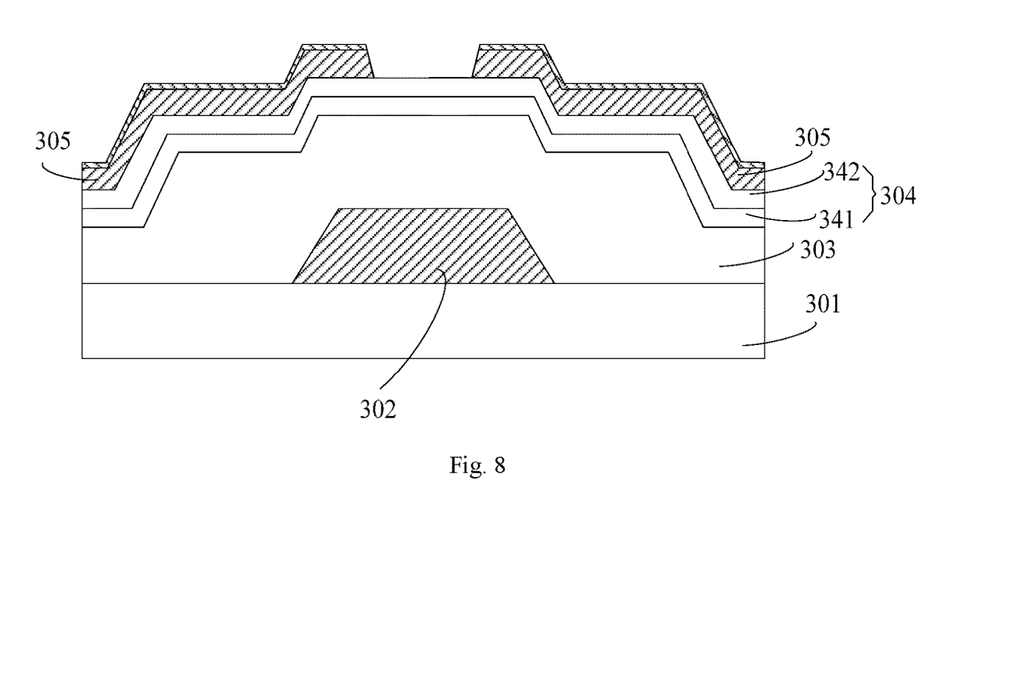
FIG. 8 is a structural schematic diagram of a manufacturing process of a thin film transistor of the embodiments of the present disclosure.

As shown in FIG. 7, after the amorphous silicon layer 341 and the N-type doped amorphous silicon layer 342 are formed, a conductive layer 356 is manufactured. In the embodiments of the present disclosure, the conductive layer 356 is the conductive layer mentioned above. As shown in FIG. 7, the conductive layer 356 comprises a metal layer 350 and an organophosphorus-metal complex 360. Then, the source/drain electrode 305 as shown in FIG. 8 is formed by the patterning process.

Figure 9:
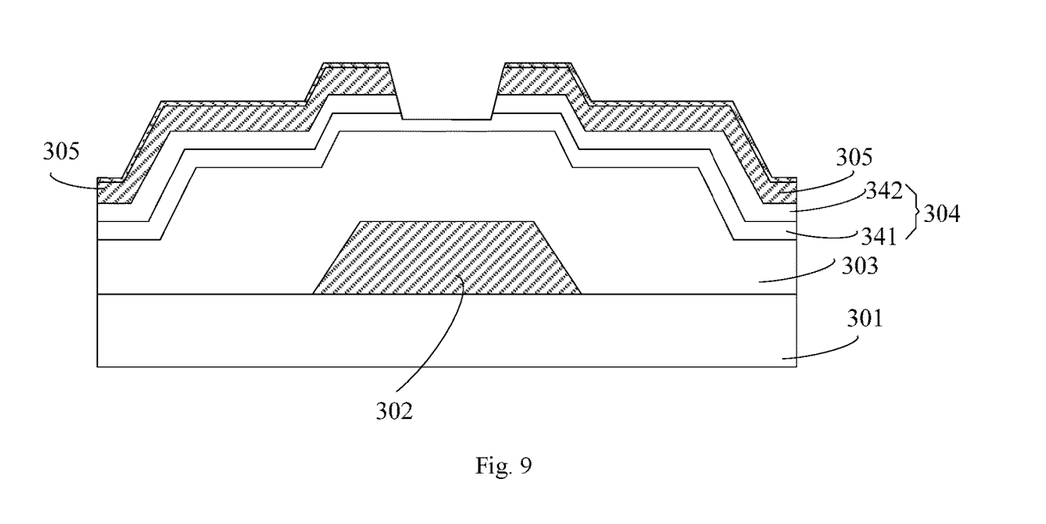
FIG. 9 is a structural schematic diagram of a manufacturing process of a thin film transistor of the embodiments of the present disclosure.

As shown in FIG. 9, after the source/drain electrode 305 is formed, the part of the N-type doped amorphous silicon layer 342 located in the source/drain electrode 305 is removed by the patterning process (may be implemented by the photoetching process).

Figure 10:
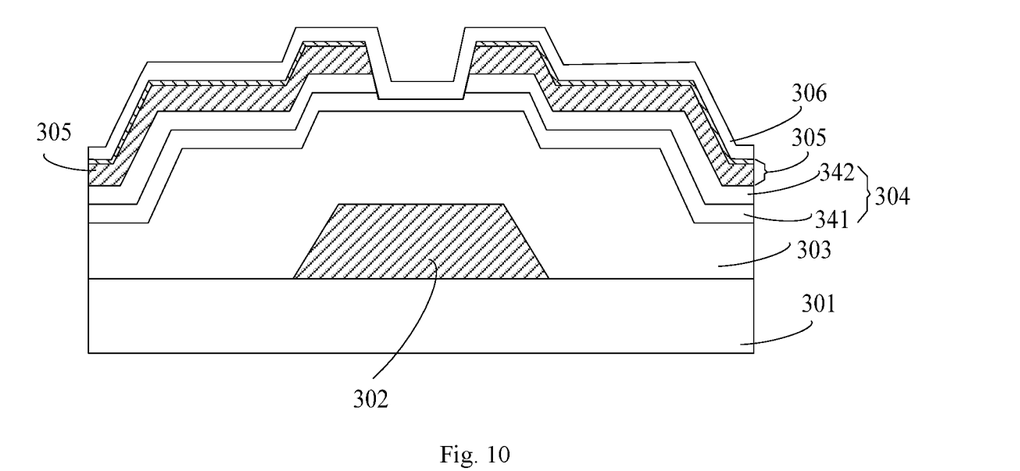
FIG. 10 is a structural schematic diagram of a manufacturing process of a thin film transistor of the embodiments of the present disclosure.

Further, as shown in FIG. 10, the method may also comprise: manufacturing a passivation layer 306 on the source/drain electrode 305.

In the manufacturing process above, at least one of the gate electrode and the source/drain electrode is manufactured from the inductive layer formed by the metal layer and the organophosphorus-metal complex mentioned above, the manufacturing process for at least one of the gate electrode and the source/drain electrode is as follows: manufacturing a metal layer; manufacturing a layer of organophosphorus-metal complex on the metal layer; and performing patterning treatment on the metal layer and the organophosphorus-metal complex thereon to obtain the gate electrode or the source/drain electrode.

In the embodiments of the present disclosure, the organophosphorus-metal complex is manufactured on the surface of the metal layer to form the conductive layer. The conductive layer is adopted as an electrode material. In one aspect, the organophosphorus-metal complex has conductivity and can prevent the surface of metal from making contact with oxygen, thereby avoiding metal oxidation under a premise of not affecting the performances of the electrode when serving as a material of the electrode in a TFT. In the other aspect, the organophosphorus-metal complex can increase a binding force between the metal and photoresist and avoids stripping of the photoresist. Therefore, etching liquid is prevented from etching the metal in a position without the need of etching. The conductive layer provided by the present disclosure has the performances in the above two aspects. Therefore, the stability and electronic transmission performances of the electrode can be improved by adopting this conductive layer to manufacture the electrode of the thin film transistor.

When the electrode or an electrode wire of the TFT is manufactured, only the metal with high conductivity has a thinning requirement, and only then will the above problems that the metal is easy to etch, the photoresist thereon is easy to strip and the like occur. The metal layer in the conductive layer above is made of, for example, Cu or Al. Of course, other metals for manufacturing the electrode, for example, Mo, Cr, Ti, etc., are not limited by the embodiments of the present disclosure. Exemplarily, when the metal layer is a copper layer, the organophosphorus-metal complex is an organophosphorus-copper complex; or, when the metal layer is an aluminum layer, the organophosphorus-metal complex is an organophosphorus-aluminum complex.

In the embodiments of the present disclosure, manufacturing a metal layer may comprise: manufacturing a metal layer by a sputtering process.

In the embodiments of the present disclosure, performing patterning treatment on the metal layer and the organophosphorus-metal complex thereon may comprise: adopting a wet-etching process to treat the metal layer and the organophosphorus-metal complex thereon. The wet-etching process for the patterning treatment can be realized by adopting the same wet-etching device for generating the organophosphorus-metal complex.

Further, manufacturing a layer of organophosphorus-metal complex on the meal layer may be implemented by adopting the following two manners.

First implementation: the wet-etching device is adopted to spray phosphorus-containing liquid on the surface of the metal layer, to form a layer of organophosphorus-metal complex. In the embodiments of the present disclosure, when the gate electrode or source/drain electrode is etched, the wet-etching manner is adopted. Therefore, it's simple and convenient to adopt the wet-etching device required for manufacturing the electrode in the TFT to manufacture the organophosphorus-metal complex, and no new device is required.

Second implementation: metal powder is enabled to react with sufficient phosphorus-containing liquid, and reacted products are dried; and the dried products are used as a target material, and a sputtering process is adopted to manufacture a layer of organophosphorus-metal complex on the metal layer. It's simple and convenient to adopt the sputtering process to manufacture the organophosphorus-metal complex and no new device is required (deposition of the metal layer may also be finished by adopting the sputtering process, and the same device may be adopted). In this implementation, the adopted sputtering process may be a low temperature sputtering process. When the low temperature sputtering process is adopted, the temperature is controlled within 20-50° C., which can avoid the high temperature decomposition of the organophosphorus-metal complex and guarantee the performances of the organophosphorus-metal complex prepared on the metal layer.

Specific processes of the two implementation above are same as step 202 and are not repeated here.

Further, when the gate electrode is obtained by performing patterning treatment on the metal layer and the organophosphorus-metal complex thereon, the method may further comprise: performing medium-temperature tempering treatment on the gate electrode, the temperature of the medium-temperature tempering treatment being lower than a recrystallization temperature of a metal adopted for manufacturing the metal layer.

Or, when the source/drain electrode is obtained by performing patterning treatment on the metal layer and the organophosphorus-metal complex thereon, the method may further comprise: performing medium-temperature tempering treatment on the source/drain electrode, the temperature of the medium-temperature tempering treatment being lower than a recrystallization temperature of a metal adopted for manufacturing the metal layer.

The medium-temperature tempering is performed on the gate electrode or the source-drain electrode. The temperature of the medium-temperature tempering treatment is lower than the recrystallization temperature of the metal, and it guarantees that the metal grain can grow up gradually. Therefore, a metal grain size of the metal can be increased, an internal stress and defects are eliminated, and tenacity is increased. Further, stability and electronic transmission performances of the source/drain electrode are improved.

It should be noted that when both the gate electrode and the source/drain electrode are prepared by adopting the conductive layer provided by the present disclosure, the medium-temperature tempering treatment may be respectively performed when the manufacturing of the gate electrode and the source/drain electrode is finished. Or, the medium-temperature tempering treatment may be performed only once after the manufacturing of the source/drain electrode is finished.

Wherein, the temperature of the medium-temperature tempering treatment may be 200-250° C. Such a temperature can guarantee the metal grain size after the medium-temperature tempering treatment.

The temperature of the medium-temperature tempering treatment is generally set to be lower than the recrystallization temperature of the metal by 50-100° C. Therefore, the recrystallization temperature needs to be determined before the temperature of the medium-temperature tempering treatment is determined. The copper is taken as an example hereinafter. The recrystallization temperature of the copper equals to m*T; m is a coefficient value and has a range of 0.25-0.35; and T is the melting temperature of the copper and has a value of 1083° C. Thus it can be known that the range of the recrystallization temperature of the copper is 270-370° C. Generally, the copper used for manufacturing the TFT is high pure copper (more than 0.9999). While, the higher the purity of the copper is, the smaller the coefficient m is. Therefore, the recrystallization temperature of the copper is below 300° C. In accordance with the principle that the medium-temperature tempering temperature is lower than the recrystallization temperature by 50-100° C., the medium-temperature tempering temperature is set to be 200-250° C., and may be 220° C. exemplarily.

The time for the medium-temperature tempering treatment may be 10-45 minutes.

In the embodiments of the present disclosure, the time for the medium-temperature tempering treatment may be 20-45 minutes. Such a time duration can guarantee the metal grain size after the medium-temperature tempering treatment. Exemplarily, the time for the medium-temperature tempering treatment is 20 min.

The time for the medium-temperature tempering treatment may be determined in accordance with following formula. The time for the medium-temperature tempering treatment equals to aD+d; D is an effective size of a workpiece (the thickness of the gate electrode or the source/drain electrode, mm, wherein the thickness of the gate electrode or the source/drain electrode equals to a sum of the thickness of the metal layer in the conductive layer mentioned above (3000-5000 Å) and the thickness of the organophosphorus-metal complex (500-2000 Å)); a is a heating coefficient and is usually 1-2.5 (min/mm); and b is additional time and is generally 10-20 min. In accordance with the formula above, the calculated time for the medium-temperature tempering treatment is 10-20 min. But it can be known from experiments that the medium-temperature tempering effect can also be realized within 20-45 min. Therefore, a range of the time for the medium-temperature tempering treatment of the present disclosure is 10-45 min.

That is to say, when the medium-temperature tempering treatment is performed, the temperature is raised to 200-250° C. at first (0.5-1 h is required), is then kept for 10-45 min and is then cooled to the room temperature inside a furnace.

The embodiments of the present disclosure provide an array substrate. The array substrate comprises a thin film transistor including a base, and a gate electrode, a gate electrode insulating layer, an active layer and a source/drain electrode which are disposed on the base in sequence. The array substrate further comprises a gate line disposed on the same layer as the gate electrode and a data line disposed on the same layer as the source/drain electrode. At least one of the gate electrode, the source/drain electrode, the gate line and the data line is manufactured from the conductive layer as shown in FIG. 1.

The embodiments of the present disclosure adopt the conductive layer formed by the metal layer and the organophosphorus-metal complex to manufacture at least one of the gate electrode and the source/drain electrode. In one aspect, the organophosphorus-metal complex has conductivity and can prevent the surface of the metal from making contact with oxygen, thereby preventing metal oxidation under a premise of not affecting performances of the electrode when serving as a material of the electrode in the TFT. In the other aspect, the organophosphorus-metal complex can increase a binding force between the metal and photoresist and avoids stripping of the photoresist. Therefore, the etching liquid is prevented from etching the metal in a position without the need of etching. The conductive layer provided by the present disclosure has the performances in the two aspects above. Therefore, the stability and electronic transmission performances of the electrode can be improved by adopting this conductive layer to manufacture the electrode of the thin film transistor.

The embodiments of the present disclosure further provide a display device comprising the array substrate described above.

In the detailed implementation, the display device of the embodiments of the present disclosure can be a mobile phone, a tablet, a TV, a displayer, a laptop computer, a digital phone frame, a GPS, or any other products or parts with display functionality.

In accordance with the embodiments of the present disclosure, the organophosphorus-metal complex is manufactured on the surface of the metal layer to form the conductive layer. The conductive layer is adopted as an electrode material. In one aspect, the organophosphorus-metal complex has conductivity and can prevent the surface of metal from making contact with oxygen, thereby avoiding metal oxidation under the premise of not affecting the performances of the electrode when serving as a material of the electrode in a TFT. In the other aspect, the organophosphorus-metal complex can increase a binding force between the metal and photoresist and avoids stripping of the photoresist. Therefore, etching liquid is prevented from etching the metal in a position without the need of etching. The conductive layer provided by the present disclosure has the performances in the above two aspects. Therefore, the stability and electronic transmission performances of the electrode can be improved by adopting such a conductive layer to manufacture the electrode of the thin film transistor.

The foregoing are only preferred embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A preparing method for a conductive layer, comprising:
   forming a metal layer; and
   forming a layer of organophosphorus-metal complex on the metal layer,
   wherein,
   the forming of the layer of organophosphorus-metal complex on the metal layer comprises using a wet-etching device to spray a phosphorus-containing liquid on a surface of the metal layer, to form the layer of organophosphorus-metal complex; or
   the forming of the layer of organophosphorus-metal complex on the metal layer comprises reacting a metal powder with a phosphorus-containing liquid, and drying the reacted metal powder and phosphorus-containing liquid; using the dried reacted metal powder and phosphorus-containing liquid as a target material, and performing a sputtering process to manufacture the layer of organophosphorus-metal complex on the metal layer.

2. The preparing method of claim 1, wherein the metal layer is a copper layer, and the layer of organophosphorus-metal complex is an organophosphorus-copper complex layer; or the metal layer is an aluminum layer, and the layer of organophosphorus-metal complex is an organophosphorus-aluminum complex layer.

3. The preparing method of claim 1, wherein the phosphorus-containing liquid is an organophosphorus compound solution, solutions of phosphoric acid and derivatives thereof, a phosphite ester solution or a phosphorus-containing heterocyclic compound solution.

4. A manufacturing method for a thin film transistor, comprising:
   providing a base; and
   forming a gate electrode, a gate electrode insulating layer, an active layer and a source/drain electrode on the base in sequence,
   wherein at least one of the gate electrode and the source/drain electrode is formed by performing the following steps:
   forming a metal layer;
   forming a layer of organophosphorus-metal complex on the metal layer; and
   performing a patterning treatment on the metal layer and the layer of organophosphorus-metal complex thereon, wherein the gate electrode is obtained by performing the patterning treatment on the metal layer and the layer of organophosphorus-metal complex thereon, and the method further comprises performing a medium-temperature tempering treatment on the gate electrode, a temperature of the medium-temperature tempering treatment being lower than a recrystallization temperature of a metal used in forming the metal layer.

5. The manufacturing method of claim 4, wherein the metal layer is a copper layer, and the layer of organophosphorus-metal complex is an organophosphorus-copper complex layer; or the metal layer is an aluminum layer, and the organophosphorus-metal complex is an organophosphorus-aluminum complex layer.

6. The manufacturing method of claim 4, wherein when the source/drain electrode is obtained by performing the patterning treatment on the metal layer and the layer of organophosphorus-metal complex thereon, the method further comprises:

performing a medium-temperature tempering treatment on the source/drain electrode, a temperature of the medium-temperature tempering treatment being lower than a recrystallization temperature of a metal used in forming the metal layer.

7. The preparing method of claim 1, wherein a thickness of the metal layer is 3000-5000 Å.

8. The preparing method of claim 1, wherein a thickness of the organophosphorus-metal complex is 500-2000 Å.

\* \* \* \* \*